United States Patent [19]

Lemelson

[11] Patent Number: 5,284,394
[45] Date of Patent: * Feb. 8, 1994

[54] BALL AND ROLLER BEARINGS AND BEARING COMPONENTS

[76] Inventor: Jerome Lemelson, P.O. Box 5076, Incline Village, Nev. 89450

[ * ] Notice: The portion of the term of this patent subsequent to Nov. 26, 2008 has been disclaimed.

[21] Appl. No.: 795,812

[22] Filed: Nov. 21, 1991

Related U.S. Application Data

[63] Continuation-in-part of Ser. No. 489,664, Mar. 7, 1990, Pat. No. 5,067,826.

[51] Int. Cl.⁵ .............................................. F16C 33/32
[52] U.S. Cl. ..................... 384/463; 384/491; 384/492; 384/565; 384/907.1
[58] Field of Search ............... 384/297, 286, 492, 491, 384/907.1, 565, 913, 569, 907, 912, 463

[56] References Cited

U.S. PATENT DOCUMENTS

| | | | |
|---|---|---|---|
| 3,001,837 | 9/1961 | Lamson et al. | 384/491 |
| 3,641,990 | 2/1972 | Kinnersly | 384/907 |
| 4,662,348 | 5/1987 | Hall et al. | 384/907.1 |
| 4,789,251 | 12/1988 | McPherson et al. | 384/907.1 |
| 4,797,009 | 1/1989 | Yamazuki | 384/907.1 |
| 5,067,826 | 11/1991 | Lemelson | 384/492 |

*Primary Examiner*—Lenard A. Footland
*Attorney, Agent, or Firm*—J. Kevin Parker

[57] ABSTRACT

Improved structures in bearings operable to receive and support shafts or members which are supported for rotation on shafts or pins are disclosed. In one form, just the inner cylindrical surface of a solid bearing made of metal or hard ceramic material is coated with a synthetic diamond material deposited in situ therein as carbon atoms by means of high energy radiation, which also serves to form synthetic diamond structures of layers of such carbon atoms so deposited. In another form, the entire race of a multiple part bearing is coated with synthetic diamond material. In a third form, a rolling member type bearing, such as a ball or roller bearing, is provided containing an inner race, an outer race, and a plurality of balls, rollers, or other rolling members supported between the inner and outer race. In certain instances, the rolling members are retained by means of a cage supported therebetween. The rolling members, inner and outer races, and, when employed, the cage, are all coated with hard synthetic diamond material deposited in situ thereon as described. Alternatively, select portions of the components of the bearing may be coated to the exclusion of other portions thereof. In all forms, the synthetic diamond material coating may be overcoated with thin layers of chromium, chromium alloys, or similar materials.

20 Claims, 1 Drawing Sheet

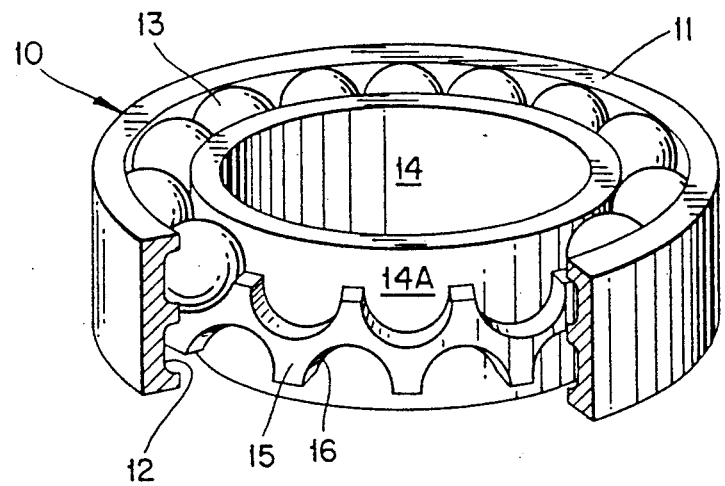
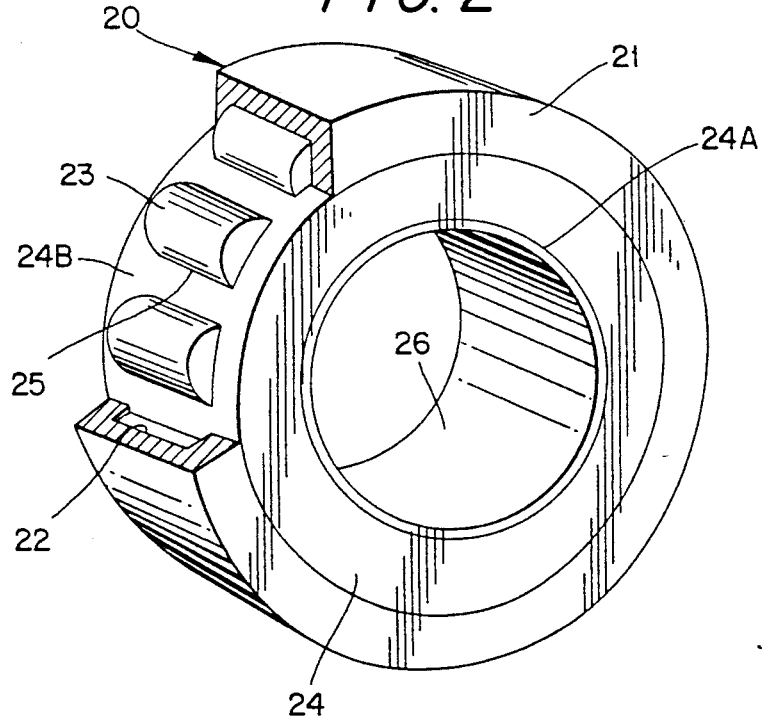
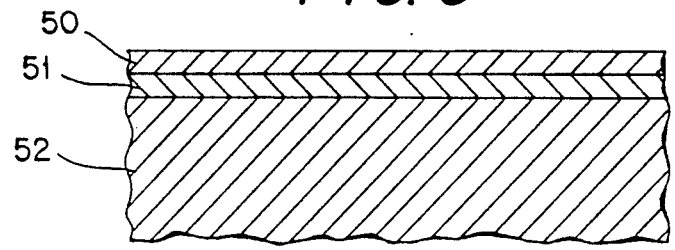

BALL AND ROLLER BEARINGS AND BEARING COMPONENTS

RELATED APPLICATIONS

This is a continuation-in-part of application Ser. No. 07/489,664, filed Mar. 7, 1990 now U.S. Pat. No. 5,067,826.

SUMMARY OF THE INVENTION

This invention relates to improvements in the structures of bearings employed to support shafts in rotation or assemblies for rotation about shafts and the like. While the invention is primarily directed to improvements in the structures of bearings having a plurality of rolling members, such as so-called ball and roller bearings, it is also directed to conventional cylindrically shaped bearing structures which do not contain a plurality of rolling member type components such as balls or rollers.

BRIEF DESCRIPTION OF THE DRAWINGS

FIG. 1 is a view of a ball bearing;
FIG. 2 is a view of a roller bearing; and
FIG. 3 is a view of detail of the diamond coating.

Conventional bearings, such as ball and roller bearings, bushings and the like, are not only subject to wear, such as frictional wear when the surfaces of bearing components and shafts engage during use, but also to failure resulting from the expansion or extension of surface irregularities, such as cracks and pits, created, for example, during the manufacture of such bearings and bearing components. Conventional machining, sintering, pressing, stamping, molding and other forming operations employed to form bearings and bearing components results in surface formations thereof which contain microirregularities such as surface cracks and the like which may be expanded during use as a result of frictional wear and impact forces applied to the surfaces containing such irregularities. The instant invention employs intense radiation directed at the surfaces of bearings and bearing components in the presence of a fluid, such as methane gas, containing carbon atoms which are caused by the intense radiation to deposit as a thin film of synthetic diamond material against the surface against which the radiation is directed. In one form of the instant invention, the carbon film fills in the tiny surface irregularities or cracks and forms a layer varying from a few millionths of an inch to a thousandth of an inch or more thick on the surface to which it is coated. The layer of synthetic diamond material serves a number of functions including protection against attrition and wear, protection against chemical corrosion and the effects of frictional heat. In a particular form of the invention, the radiation is sufficient to heat and reduce or melt the thin outer stratum of the surface being coated with the diamond film so as to reduce the size of or eliminate the cracks formed therein during the fabrication of the bearing.

In a preferred modified form of the invention, after a thin layer of synthetic diamond film is formed on the surface of a bearing or bearing component, it is overcoated with a thin layer of a wear resistant dry lubricating material, such as hard chromium, chromium alloy or other suitable hard surfacing material. Such outer layer serves to protect the outer surface of the diamond coating on which it is disposed, from abrasive effects of abrasive elements provided in a lubricating material and the effect of surface wear during contact with adjacent shaft or bearing surfaces.

Accordingly it is a primary object of this invention to provide new and improved structures in bearings utilized in rotational mechanical assemblies.

Another object is to provide improvements in the structures of ball bearings.

Another object is to provide improvements in the structures of roller bearings.

Another object is to provide improvements in the structures of balls employed in ball bearings.

Another object is to provide improvements in the structures of rollers employed in roller bearings assemblies.

Another object is to provide improvements in the structures of races employed in ball or roller bearings.

Another object is to provide improvements in the structures of cages employed in ball or roller bearing assemblies.

Another object is to provide improved ball and roller bearing assemblies containing multiple components which contact each other, the contacting surfaces of which components are coated with thin hard synthetic diamond films.

Another object is to provide improved ball and roller bearing assemblies containing multiple components which contact each other, the contacting surfaces of which components are coated with thin hard synthetic diamond films which are overcoated with lubricating protective coatings such as chromium, chromium alloys and the like.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

In Fig. 1 is shown details of a ball bearing 10 which is formed of an assembly of hard load supporting balls 13 preferably formed of metal such as steel and supported in circular array between a cylindrically shaped steel outer race 11 and a steel inner race 14. A cage 15 also made of steel, such as stainless steel, is also supported between the two races to retain the balls in spaced apart from each other in two circular arrays as shown. The balls 13, which are of the same diameters may also be formed of other suitable metal or hard ceramic and effect rolling movement when a machine element secured to the outer race 11 effects rotation about a shaft secured to the inner race 14 or visa versa.

Coating the entire outer surfaces of the balls 13 and either the entire outer surfaces of the races 11 and 14 and cage 15 or just the surfaces thereof which make contact with the balls 13, is a hard synthetic diamond material 17 formed in situ on such components by the deposition of carbon atoms from a carbon atom containing material such as methane gas mixed with hydrogen when such gas mixture and the article therein are subject to intense radiation such as suitable microwave radiation which is beamed at the surface or surfaces being coated. Notations 17A, 17B, 17C and 17D refer respectively to such synthetic diamond material coating respectively the balls 13, the outer race 11 or the inner surfaces of the illustrated ball engaging/channels formed therein, the cage 15 or just the semi-cylindrical surfaces 16 thereof which engage the balls and the inner race 14 or just the outer cylindrical surface thereof. The depth or thickness of such synthetic diamond coating may vary from several millions of an inch to a thousandth of an inch or more depending on the size of the bearing, loading expected thereon during use, temperature of operation and impact forces which may be applied thereto. Large ball bearings may require synthetic diamond coatings in the range of 0.001" to 0.010" or more. Overcoating such synthetic diamond layer is a layer of a hard solid lubricating material such as chromium of the same or greater thickness than the hard carbon coating which serves to protect the synthetic diamond coating from erosion due to rolling friction. The combination of the synthetic diamond coating and its overcoating of chromium serve to substantially enhance the wear resistance and life of the components coated therewith, particularly in preventing microcavities or cracks which normally are formed in the outer stratum of the machined elements, from expanding and eventually resulting in the destruction of the component or in rendering it inefficient in operation.

Depending on the thicknesses of the synthetic diamond layer and chromium overcoating layer, either or both such coatings may serve to enhance the strength of the component to which they are applied and to absorb a substantial amount of the load and impact forces applied during operation of the bearing. While the primary function of the synthetic diamond coating is to protect the component from experiencing failure of the surface stratum of the base material thereof by distributing impact and load forces applied thereto and preventing the formation and/or extension of surface defects such as small cracks and occlusions, it also serves to resist deformation in shape of the balls, the inner and outer races and, if applied, the cage. Frictional wear of the semi-cylindrical surfaces of the side walls of the cage ball retaining portions will also be greatly reduced, particularly if the synthetic diamond coating is overcoated with chromium.

In FIG. 2 is shown a roller bearing 20 formed of an assembly of an outer race 21, and an inner race 24 having a plurality of semi-cylindrical cavities 25 formed therein with the outer race containing a channel 22 configured to accommodate a plurality of cylindrical bearing rollers 26 slidably or rollably supported within the cavities 23. A cylindrical bearing sleeve 27 is secured within the inside bore 24A of the inner race 24. The rollers 23 are coated with a synthetic diamond material 27 forming a layer 27A completely surrounding each roller and formed in situ thereon by the deposition and consolidation of carbon atoms stripped from molecules of carbon atom containing gas, such as methane subjected to a beam or beams of high intensity microwave radiation or the like. Such thin coating of synthetic diamond material which is also applied to the semi-cylindrical surfaces of the recesses 25 in the inner race 24 and the wall surfaces of the channel 22 formed in the outer race 21. Notation 27A refers to the synthetic diamond material coating the outer surfaces of the rollers 25; 27B to the synthetic diamond material coating the surfaces of the channel 22 in the outer race and 27C to the synthetic diamond material coating the semi-cylindrical surfaces of the recesses 25 in the outer surface of the inner race 24. Such synthetic diamond material may also extend completely around and coating all of the surfaces of the outer race 21 and the cylindrical outer surface 24A of the inner race 24 as well as the side walls of such races and the outer and inner walls of the outer and inner races. Notation 27D refers to such synthetic diamond material coating the inside surface 26A of the sleeve 26, although if a friction fit is required between such inner surface and a shaft supporting the assembly 20, such synthetic diamond material may be eliminated from the sleeve 26.

A thin layer 28 of chromium extends across all or selected portions of the synthetic diamond surfaces to protect same against rolling or sliding frictional wear, scouring, chemical corrosion and erosion.

In the bearing structures 10 and 20 illustrated in FIGS. 1 and 2, select portions of the various bearing components may be coated with synthetic diamond and chromium layers, rather than the whole outer surfaces thereof. For example, just the balls 12 and the rollers 25 may be so coated and overcoated; the outer surface 13A of the inner race against which the balls roll and/or the inner surfaces 11A and 11B of the channels formed in the outer race. Similar composite coatings may be applied to the outer surfaces of the rollers 23, the walls of the semi-cylindrical cavities 25 in the inner race, the outer surface 24A of the inner race or any other surfaces subjected to rolling or sliding wear, chemical attack, surface erosion or failure caused the extension of cavities or microcracks formed during machining same to shape.

The inner race 13 or sleeve 26 may also serve as a bearing per se, made of suitable metal or high strength ceramic material and having the inside surface thereof coated with synthetic diamond material as described for retaining and supporting or being supported by a cylindrical shaft forming part of a machine assembly such as a power driven or drivable member of assembly. As set forth above, such synthetic diamond coating may cover just the inside cylindrical inside surface of such bearing or the entire bearing and the portion of such synthetic diamond coating which is aligned with such shaft may be coated with one of the metals described above, such as chromium, to lubricate and protect the surface of the diamond material coating such shaft. While the shaft may be the shaft of a motor or motor driven assembly, such bearing may support or be supported by another machine element, pillow blocks or assembly for supporting the shaft as it rotates or rotating on such shaft.

In FIG. 3 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493, in thickness which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Certain modifications to the structures and methods for making same may be found in my parent application Ser. No. 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer surface or surfaces of the articles to the exclusion of another area or areas thereof for functional and/or economic purposes. Such an electron beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coatings(s) which may be applied as a single or plurality of layers per se or combined or overcoated with one or more layers of the described metals and/or metal alloys to lubicate and protect the surface of the synthetic diamond coating.

4. Coatings formed of a plurality of layers of synthetic diamond material formed as described between respective layers of the same or different metals, metal alloys and/or ceraimic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof as set forth in such patent may also be mixed with such particulate material(s) to form articles of the type(s) described herein having superior substrate strength and corrosion resistance. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at temperature to burn away the resin leaving a porous substrate of desired shape. By placing such porous substrate in a chamber containing a mixture of hydrocarbon gas and hydrogen under pressure, molecules of the gas mixture will flow into the pores or intersticies of such substrate, particularly if the chamber and substrate therein are first subjected to suitable vacuum. Thereafter by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characterics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications.

8. A plurality of the components of the ball bearing 10 of FIG. 1 and the roller bearing 20 of FIG. 2 may be coated with a high strength frictional wear resisting material such as the described synthetic diamond material or other hard surfacing material deposited thereon such as by chemical vapor or gaseous means employing microwave radiation or other means, with or without the plating or electroless deposition and outercoating of a lubricating material such as chromium. For example, the entire outer surfaces of either or both the outer race 11 and the inner race 14 may be coated with synthetic diamond material as described to reduce frictional wear caused by contact of the rolling balls 13 thereagainst and to prevent spalling or pitting during use. In such construction, the balls 13 may either be uncoated or coated with synthetic diamond or the like as described. If diamond coated, the diamond coatings on the balls are preferably overcoated with a solidlubricating material such as chromium to prevent rolling contact between two synthetic diamond surfaces; e.g. the diamond coatings on the balls and on either or both of the races 11 and 14 or the surfaces thereof which make contact with the balls. Conversely, the surfaces of either or both the races 11 and 13 which contact the balls 13 may contain a first layer of synthetic diamond overcoated with a thin layer of chromium or other suitable hard lubricant wherein the balls may either be diamond coated per se or diamond coated and overcoated with such chromium or other suitable hard lubricant.

9. Similar composite material arrangements and constructions defined above and relating to components of ball bearings may also be applied to rollers and roller bearings of the type shown in FIG. 3 wherein frictional wear, load and impact damage to the rollers and races are substantially reduced resulting in longer use/and may be effected by the combinations of coatings described above for ball bearings and their components.

10. As set forth in my copending U.S. patent application Ser. No. 07/696,747 filed May 7, 1991 and in the parent applications therefor, the deposited diamond films and/or the substrate material to which they are bonded or are to be bonded may be subject to the intense radiation of one or more electron beams and/or laser beams per se or sequentially or in the presence of microwave radiation to effect such operations as (a) cause or enhance bonding or welding between such hard film or layer to the substrate or surface on which they are or are about to be deposited, (b) micro machine or shape the surface onto which such film or films are deposited, (c) dope or ion implant one or more elements and/or compounds into all or select portions of the deposited film or films, (d) speed-up or enhance the rate of deposition and conversion of carbon atoms from the gas or vapor used to effect chemical vapor deposition and formation of the synthetic diamond film and/or one or more of the described overcoatings therefor, (e) improve the internal and/or surface structure of the synthetic diamond film and/or the chromium or other protective lubricating overcoating, (f) selectively machine or erode a select portion or portions of the diamond film and/or the overcoating therefor; (g) effect the selective and controlled deposition and formation of the diamond film and/or the lubricating and protective material overcoating same. Methods and apparatus employing a master controller or computer for controlling intense beam generating means such as an electron gun and one or more power operated devices such as motors for operating work positioning and conveying means disclosed in said patent application Ser. No. 7/696,747 may thus be employed to controllably and selectively deposit and form diamond films per se or in the presence of microwave energy from molecules of a gas and/or vapor containing carbon atoms, such as methane gas or other hydrocarbon compounds. The same or auxilliary electron and/or laser beam radiation to effect or enhance deposition and formation of the synthetic diamond film may also be employed to enhance the crystalline structure of the diamond coating or film and/or its surface structure and may also be employed to effect or enhance the deposition of one or more overcoatings of lubricating or protective layers of material or materials of the types described above. Similarly such computer controlled techniques for generating and effecting controlled scanning of a surface for heating, depositing, ion implanting and/or surface machining same may also be applied to the surface stratum of the substrate before the described synthetic diamond film or coating is applied thereto to condition same to permit suitable bonding of the deposited carbon atoms and/or to form and construct microcircuits and microcircuit elements beneath the surface of the diamond film.

11. The computer controlled beam machining, erosion, coating, implanting, finishing and deposition techniques defined in said copending application Ser. No. 07/696,747 may also be employed to surface machine, deposit and form microcircuits including switching elements conducting interconnects and the like on a synthetic diamond film applied to a substrate such as a silicon wafer or to a similarly constructed circuit layer or layers on a substrate.

12. To enhance the bonding of the solid lubricating material to the outer surface of the synthetic diamond material, such outer surface may be subject to the scanning radiation of one or more scanning radiation beams of the types described and machined or otherwise treated. Selective ion implantation may also be employed as described to effect either or both the functions of improving the surface structure of the deposited material to permit it to be employed per se to protect the object to which it is applied or to permit it to properly receive and properly bond to an outer protective and lubricating coating as described.

What is claimed is:

1. A ball bearing assembly comprising in combination:
   a) a cylindrical outer ring-shaped race made of hard material and having an inner cylindrical surface, b) a cylindrically shaped inner race made of hard wear-resistant material and forming an assembly with said outer race, c) said inner race having an outer cylindrical surface spaced apart from said inner surface of said outer race, d) a plurality of composite spherically shaped balls contained between said outer and inner races and sized for rolling movement therebetween against portions of said cylindrically shaped inner and outer surfaces of said outer and inner races, e) each of said composite spherically shaped balls being formed of a spherical core made of hard load supporting material, f) each of said spherical ball cores having a coating of synthetic diamond material formed in situ on and completely covering its spherical outer surface defining a spherically shaped shell of sufficient thickness to protect the surface stratum of the spherical core from developing surface occlusions such as surface cracks and from the spread of surface defects due to impact loads applied to said ball bearing during its operation while rotationally supporting a plurality of machine elements.

2. A ball bearing assembly in accordance with claim 1 wherein said spherically shaped ball cores are made of steel.

3. A ball bearing assembly in accordance with claim 1 wherein said spherically shaped ball cores are made of a hard load bearing ceramic material.

4. A ball bearing in accordance with claim 1 including a cage assembled between said outer and inner races for retaining said balls spaced apart between said races, each of said composite spherically shaped balls having a layer of hard lubricating material, such as chromium, coating and completely surrounding the outer surface of the synthetic diamond material which covers the spherical outer surface of its core.

5. A ball bearing in accordance with claim 1 including a cage assembled between said outer and inner races and shaped for retaining a plurality of circular arrays of said balls spaced apart from each other between said outer and inner races, said cage having a plurality of arcuately shaped surface portions each conforming to a portion of the spherical outer surface of a respective of said spherically shaped balls.

6. A bearing and shaft supported for relative rotation between said bearing and said shaft comprising:

a) a bearing defined by a rigid ring shaped member having an inside load supporting surface of revolution, b) a shaft rotationally supported within said ring shaped member and having an outer surface portion conforming to said inside surface of revolution of said ring shaped member, c) said shaft and bearing sized to permit relative rotational sliding movement between said shaft and said ring shaped member, d) said inside load supporting surface of said ring shaped member being coated with a layer of synthetic diamond material formed in situ thereon and bonded to said load supporting surface and operable to resist frictional wear during the relative rotation between said shaft and said bearing.

7. An assembly in accordance with claim 6 including a solid lubricating material, such as chromium, disposed between the outer surface of said synthetic diamond coating formed on the inner surface of said ring shaped member and the surface of said shaft aligned therewith.

8. An assembly in accordance with claim 7 wherein said solid lubricating material is coated on the outer surface of said synthetic diamond material coating the inner surface of said ring shaped member.

9. An assembly in accordance with claim 7 wherein said solid lubricating material has a thickness in the range of 0.0001" to 0.003".

10. An assembly in accordance with claim 6 wherein said layer of synthetic diamond material is applied to said load supporting surface in a thickness in the range of 0.000001" to 0.010".

11. An assembly in accordance with claim 6 wherein said rigid ring shaped member has its entire outer surface coated with said layer of synthetic diamond material.

12. An assembly in accordance with claim 6 wherein said ring shaped member is formed of a hard ceramic material.

13. An assembly in accordance with claim 6 wherein said ring shaped member is a bushing.

14. A race for use in bearing assemblies for retaining a plurality of rolling members in circular array within a bearing assembly, said race being formed of a hard material and having at least one circular passageway having a wall means shaped to confine and permit rolling movement between said plurality of rolling members and said race, said wall means defining at least one surface of revolution, said surface of revolution being coated with a synthetic diamond material deposited in situ thereon to a thickness sufficient to resist frictional wear when engaged by said rolling members under load during use of said bearing.

15. A race in accordance with claim 14, the outer surface of said synthetic diamond material coating said surface of revolution of said wall means being coated with a solid lubricating material.

16. A race in accordance with claim 15 wherein said solid lubricating material is a thin layer of chromium of substantially constant thickness.

17. A race in accordance with claim 16 wherein said layer of chromium is less than 0.001" thick.

18. A race in accordance with claim 14 wherein said synthetic diamond material has a thickness in the range of 0.000001" to 0.010".

19. The race as set forth in claim 14 wherein said race is adapted for retaining a plurality of balls.

20. The race as set forth in claim 14 wherein said race is adapted for retaining a plurality of rollers.

* * * * *